United States Patent
Schroder et al.

(10) Patent No.: US 11,358,381 B1
(45) Date of Patent: Jun. 14, 2022

(54) METHOD FOR ATTACHING AND DETACHING SUBSTRATES DURING INTEGRATED CIRCUIT MANUFACTURING

(71) Applicant: NCC NANO, LLC, Dallas, TX (US)

(72) Inventors: Kurt A. Schroder, Coupland, TX (US); Vikram Shreeshail Turkani, Austin, TX (US); Vahid Akhavan Attar, Austin, TX (US); Sze-Ming Lee, Cedar Park, TX (US)

(73) Assignee: PulseForge Corp., Austin, TX (US)

( * ) Notice: Subject to any disclaimer, the term of this patent is extended or adjusted under 35 U.S.C. 154(b) by 0 days.

(21) Appl. No.: 17/219,199

(22) Filed: Mar. 31, 2021

(51) Int. Cl.
*B32B 43/00* (2006.01)
*H01L 21/683* (2006.01)
*B32B 38/10* (2006.01)

(52) U.S. Cl.
CPC ........ *B32B 43/006* (2013.01); *H01L 21/6836* (2013.01); *B32B 38/10* (2013.01); *B32B 2457/14* (2013.01); *Y10T 156/1158* (2015.01); *Y10T 156/1917* (2015.01)

(58) Field of Classification Search
CPC . B32B 38/10; B32B 43/006; Y10T 156/1158; Y10T 156/1917
See application file for complete search history.

(56) References Cited

U.S. PATENT DOCUMENTS

| | | | |
|---|---|---|---|
| 2010/0038035 A1* | 2/2010 | Noda | B32B 43/006 156/379.6 |
| 2012/0295415 A1* | 11/2012 | Ono | H01L 23/481 438/455 |
| 2013/0084459 A1* | 4/2013 | Larson | C09D 133/16 428/422 |
| 2013/0280886 A1* | 10/2013 | Kato | H01L 24/83 438/459 |
| 2014/0116615 A1* | 5/2014 | Ogawa | B32B 37/12 156/275.5 |
| 2015/0083343 A1* | 3/2015 | Fujii | B32B 43/006 156/712 |
| 2015/0132924 A1* | 5/2015 | Dang | H01L 21/6835 438/464 |
| 2016/0343601 A1* | 11/2016 | Ishida | B32B 38/10 |
| 2019/0330504 A1* | 10/2019 | Lin | C08G 73/1064 |

* cited by examiner

*Primary Examiner* — Philip C Tucker
*Assistant Examiner* — Nickolas R Harm
(74) *Attorney, Agent, or Firm* — Antony P. Ng; Russell Ng PLLC

(57) ABSTRACT

A method for attaching and detaching a substrate from a bonded stack is disclosed. A broadband light-absorbing material is combined with an adhesive material to form a broadband light-absorbing adhesive. A layer of the broadband light-absorbing adhesive is then applied on one side of a transparent carrier. A substrate is placed on the broadband light-absorbing adhesive and the transparent carrier to form a bonded stack. The substrate can be a wafer or a polymeric film. At this point, processing steps can be performed on the substrate. After the processing steps have been completed, a light pulse from a flashlamp is utilized to heat up the broadband light-absorbing adhesive in order to loosen the substrate from the bonded stack such that the substrate can be easily detached from the bonded stack.

16 Claims, 4 Drawing Sheets

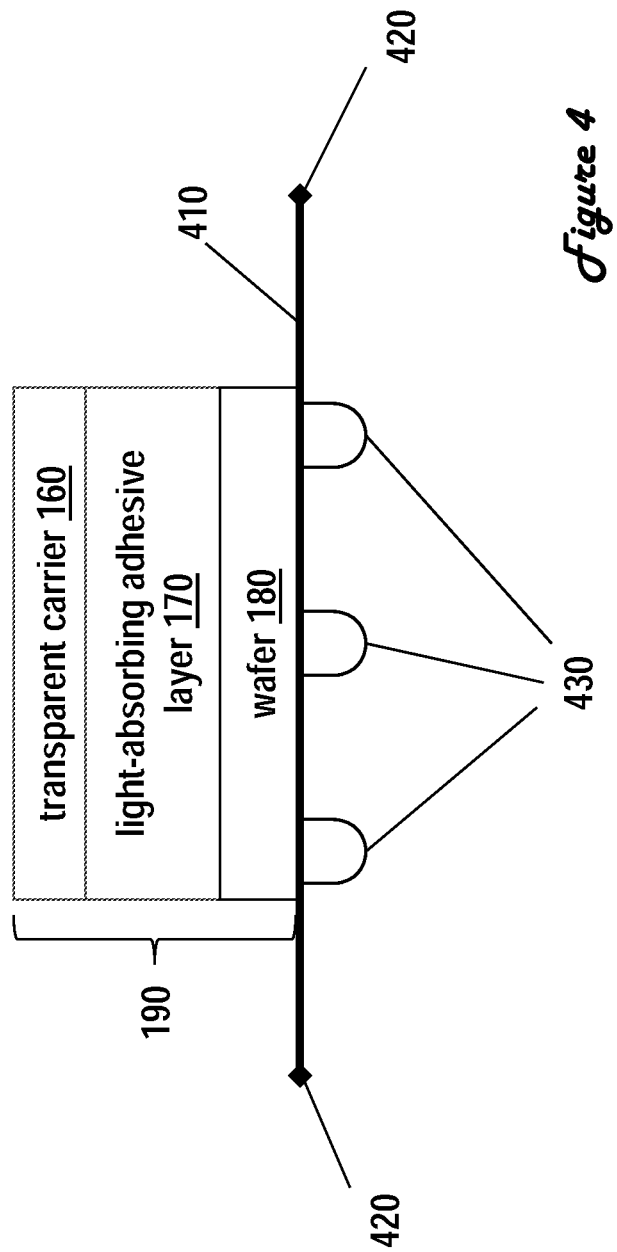

METHOD FOR ATTACHING AND DETACHING SUBSTRATES DURING INTEGRATED CIRCUIT MANUFACTURING

TECHNICAL FIELD

The present application relates to method for processing integrated circuits in general, and, in particular, to a method for attaching and detaching substrates during integrated circuit manufacturing.

BACKGROUND

Three-dimensional (3D) chip technologies have been gaining popularity in the microelectronics industry because of their advantages such as shorter circuit paths, higher performance, less power consumption and faster heat dissipation. With 3D chip technologies, multiple heterogeneous silicon wafers can be stacked vertically to form a 3D integrated circuit. The silicon wafers are relatively thin (50-100 µm) such that they can be interconnected by utilizing through-silicon vias (TSVs).

The present disclosure provides a method for attaching and detaching substrates during the manufacturing of 3D integrated circuits.

SUMMARY OF THE INVENTION

In accordance with one embodiment, a broadband light-absorbing material is combined with an adhesive material to form a broadband light-absorbing adhesive. A layer of the broadband light-absorbing adhesive is then applied on one side of a transparent carrier. A substrate is placed on the broadband light-absorbing adhesive and the transparent carrier to form a bonded stack. The substrate can be a wafer or a polymeric film. At this point, processing steps can be performed on the substrate. For example, the thickness of a wafer can be reduced via a thinning step, or electronic components can be built on a polymeric film. After the processing steps have been completed, a light pulse from a flashlamp is utilized to heat up the broadband light-absorbing adhesive in order to loosen the substrate from the bonded stack such that the substrate can be easily detached from the bonded stack. The substrate is subsequently transported to another station for further processing.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1A is a diagram of a wafer stack made by the method depicted in FIG. 1;

FIG. 1B shows a wafer being released from the wafer stack from FIG. 1A;

FIG. 2A is a diagram of a stack made by the method depicted in FIG. 2;

FIG. 2B shows a polymeric film being released from the stack from FIG. 2A;

FIG. 4 illustrates a vacuum table holding down a wafer assembly, according to one embodiment.

DETAILED DESCRIPTION OF A PREFERRED EMBODIMENT

During the manufacture of a three-dimensional (3D) integrated circuit, a thinning step is required to be performed on each silicon wafer of the 3D integrated circuit in order to reduce the thickness of the silicon wafer. The silicon wafer can be attached to a rigid carrier prior to the thinning process via an adhesive placed directly between the silicon wafer and the rigid carrier. After back-grinding and all the required backside processing have been performed on the silicon wafer, the thinned silicon wafer needs to be detached from the rigid carrier so that the thinned silicon wafer can progress to other processing steps.

Current techniques for detaching a silicon wafer from a rigid carrier include: (a) using chemical solvents to dissolve the adhesive between the silicon wafer and the carrier, (b) using mechanical means to detach the silicon wafer from the carrier, and (c) heating the adhesive between the silicon wafer and the carrier to a point that the silicon wafer can be easily separated from the carrier by shearing. However, the usage of harsh chemicals is not very desirable. Also, mechanical means or high temperature may cause damage to the surface structure of the silicon wafer.

Figure 1:
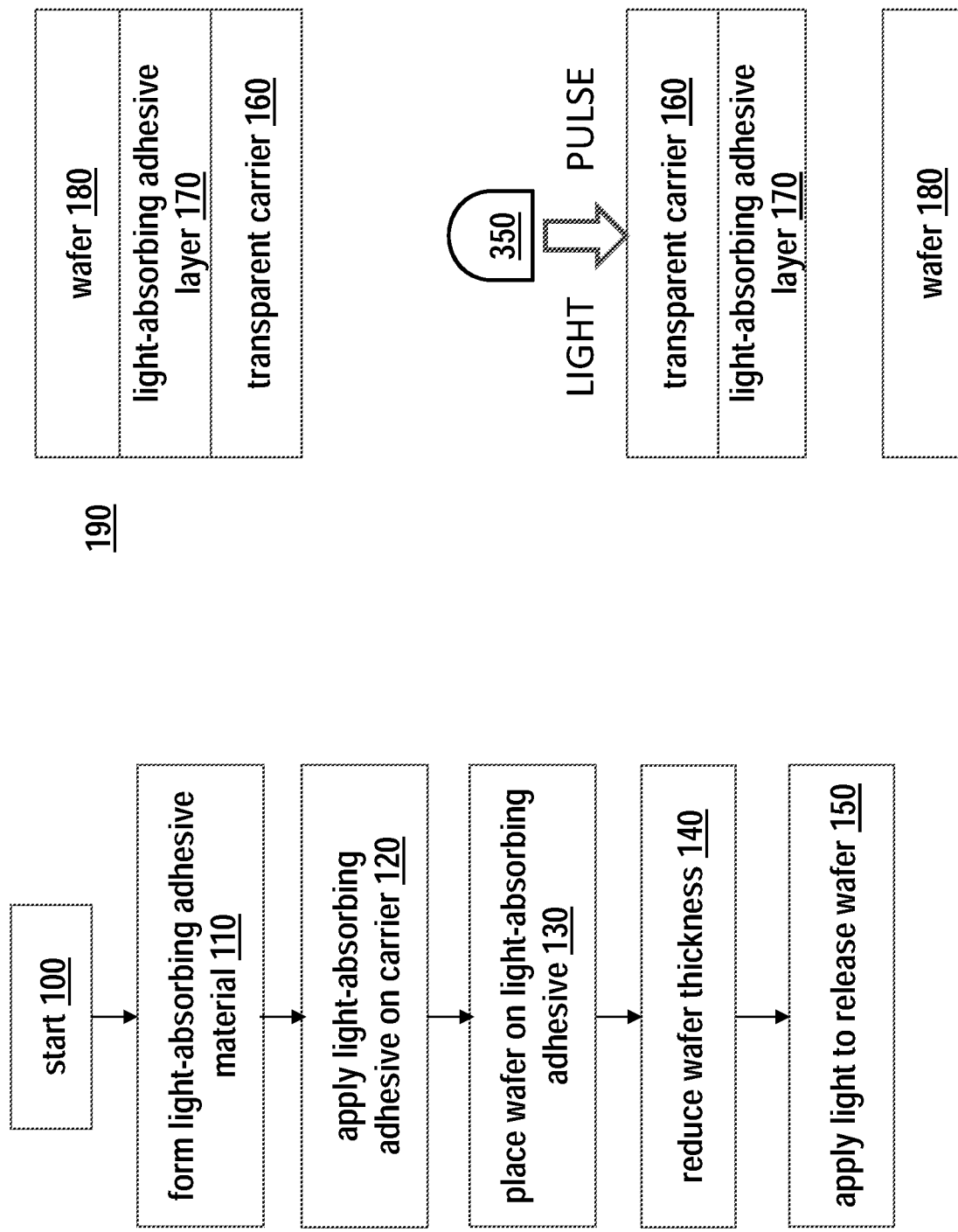
FIG. 1 is a flow diagram of a method for attaching and detaching a wafer from a carrier, according to one embodiment.

Referring now to the drawings and in particular to FIG. 1, there is depicted a flow diagram of a method for attaching and detaching a wafer from a carrier, according to one embodiment. Starting at block 100, a broadband light-absorbing adhesive is initially formed by combining an adhesive material combined with a broadband light-absorbing material, as shown in block 110.

The adhesive material may be polar or non-polar. It may be a thermoplastic or thermoset. It may be cured thermally, via ultra-violet light, via chemical reaction, or may be formed via solvent evaporation.

The broadband light-absorbing material may be a pigmented material such as carbon black, which is absorptive over the entire emission spectrum of a flashlamp (i.e., 200 nm-1,100 nm). The more absorptive the broadband light-absorbing material is over the above-mentioned emission range, the higher the percentage of the emission from the flashlamp will be converted to heat in the broadband light-absorbing adhesive. The light-absorbing material may also be a dye or a combination of multiple dyes that absorb selective portions of the emission spectrum of the flashlamp.

Alternatively, the broadband light-absorbing adhesive can be formed by combining an adhesive material with a broadband light-absorbing material and a gas generating material. The adhesive material and the broadband light-absorbing material are the same as above. The gas generating material is a material that sublimates or boils at a temperature lower than the boiling temperature of the adhesive material. Some gas generating materials can also serve as light-absorbing material. For example, a sublimation dye is both optically absorptive of light pulses from a flashlamp and sublimes to generate gas when it is heated to a particular temperature.

The broadband light-absorbing adhesive is then applied as a broadband light-absorbing adhesive layer, such as a broadband light-absorbing adhesive layer 170 in FIG. 1A, on one side of a transparent rigid carrier, such as a transparent carrier 160 in FIG. 1A, as depicted in block 120. Carrier 160 may be made of quartz, glass or any rigid material that transmits light (between 200 nm and 1,100 nm) emitted by a flashlamp. An exemplary example includes Corning Eagle XG glass, which is a common type of glass used in the display industry.

Next, a wafer 180 is placed on broadband light-absorbing adhesive layer 170, as shown in block 130. Wafer 180 includes electronic devices and/or electrical components that are previously built on one surface of wafer 180. Pressure can be applied on wafer 180 to adhere wafer 180 to broadband light-absorbing adhesive layer 170 and carrier 160. Wafer 180 may be heated during the application of pressure onto wafer 180 in order to increase the adhesive bond between wafer 180 and carrier 160. At this point, a bonded wafer stack is formed, such as a bonded wafer stack 190 shown in FIG. 1A, which includes transparent carrier 160, broadband light-absorbing adhesive layer 170, and wafer 180.

Wafer 180 of wafer stack 190 is then subjected to a back-thinning process in order to reduce the thickness of wafer 180, as depicted in block 140. Afterwards, wafer 180 is detached (debonded) from bonded wafer stack 190 by exposing the non-wafer side of transparent carrier 160 to an intense pulse of light from a flashlamp, such as a flashlamp 350 in FIG. 1B, as shown in block 150, in order to heat up broadband light-absorbing adhesive layer 170. As a result, broadband light-absorbing adhesive layer 170 is heated to a point that wafer 180 will be released from bonded wafer stack 190, as shown in block 150.

If the gas generating material is added to adhesive layer 170, the gas generating material can generate gas at the interface between carrier 160 and adhesive layer 170 in order to promote delamination of adhesive layer 170 from carrier 160 when adhesive layer 170 reaches a particular temperature. The gas generating material becomes gaseous at a lower temperature than the polymer system of the adhesive material. With the presence of the gas generating material, the temperature at which gas is generated can be decoupled from the other thermal and mechanical properties of the adhesive material as it is only a minor additive.

Example 1

10 g of poly(2-ethyl-2-oxazoline), which is a water-soluble thermoplastic polymer available from Aquazol (grade 5), was added into 10 g of 5 wt % carbon black (Cabot Monarch® 700) solution in water to form a composition. The composition was mixed using a planetary centrifugal mixer at 2,000 rpm for 20 mins. The resultant mixture was a homogenous, black, and viscous liquid dispersion that can be utilized as a broadband light-absorbing adhesive. The dispersion (i.e., broadband light-absorbing adhesive) was coated onto a 75 mm×75 mm, 0.5 mm thick Corning Eagle XG glass using a #0 Mayer rod and 100 micron thick tape shims to coat a wet film thickness of approximately 100 microns. The dispersion was then dried at 140° C. for 30 minutes to obtain a black light absorber film adhered on the Corning Eagle XG glass that was approximately 50 microns thick. The transmission of the film was measured to be less than 1% via an XRite® densitometer. Next, a second piece of Corning Eagle XG glass was compression bonded to the first piece Corning Eagle XG glass with the dried dispersion in between, by placing a 2.5 Kg weight on the stack while the stack was heated to 220° C. for 40 minutes to melt the polymer and bond the two pieces of glass together. Next, the stack was illuminated from the coated glass side using a flashlamp (PulseForge® Invent model IX2-951 manufactured by NovaCentrix®). The threshold to detach the two pieces of glass was at a charging voltage of 950 V with a pulse duration of 80 microseconds. This condition deposited 1.86 J/cm$^2$ of energy onto the bonded stack. After irradiation, a delamination occurred at the interface of the flashlamp facing glass and the adhesive.

It is noted that the thinner the wafer, the easier it is for the wafer to be detached from a carrier plate. This is because the wafer is very thermally conductive. Silicon, for example, has a thermal conductivity of about 140 W/cm-K, which is over 100 times greater than the carrier plate such as glass. As such, much of energy from the light absorbing layer is conducted to the wafer through the adhesive layer during the 50-150 microsecond time the absorber is being irradiated by the pulse of light. When the adhesive layer reaches the detaching temperature, it becomes detached from the carrier. The thinner the wafer, the quicker the adhesive reaches the detachment temperature. Thus, a thinner wafer may be detached with a shorter pulse of light at the same intensity. An advantage is that less energy is needed to perform the detachment process. Additionally, the shorter time duration increase the lifetime of flashlamps. The intensity of the emission from a flashlamp can be decreased for a given pulse length, which also reduces the total amount of energy deposited into the wafer.

The minimum detaching threshold of the adhesive from the glass carrier can be determined by omitting the second piece of glass that absorbs some of the thermal energy from the light pulse. The measured threshold of adhesive detachment was at a charging voltage of 950 V with a pulse duration of 70 microseconds, and this condition corresponded to a radiant exposure of 1.53 J/cm$^2$ emitted by the flashlamp.

The detaching threshold of the adhesive from the glass carrier is again measured by adding 2% ethylene glycol to the adhesive. The measured threshold of adhesive detachment was at a charging voltage of 950 V with a pulse duration of 65 microseconds, and this condition corresponded to a radiant exposure of 1.40 J/cm$^2$ emitted by the flashlamp. It is believed that the reduced threshold for delamination over the above-mentioned results was the addition of ethylene glycol that acted as a gas generating material. Ethylene glycol boils at 197° C., while the higher temperature Aquazol is thermally stable beyond 300° C. Broadband light-absorbing adhesive layer 170 has a good absorption of light pulses from a flashlamp while having enough transmission to allow alignment of wafer 180 on carrier 160. Even a 0.1% transmission through adhesive layer 170 is enough for alignment, but preferably greater than 1% or even up than 10% transmission is enough for easy alignment without the light pulses from a flashlamp from harming wafer 180 during the detaching process. For example, adhesive layer 170 absorbs greater than 80% of the light pulse emission from the flashlamp while passing between 1% and 10% of the light pulse emission for wafer alignment.

In addition to wafers, the present invention is also applicable to polymeric films on which electronic devices can be fabricated.

Figure 2:
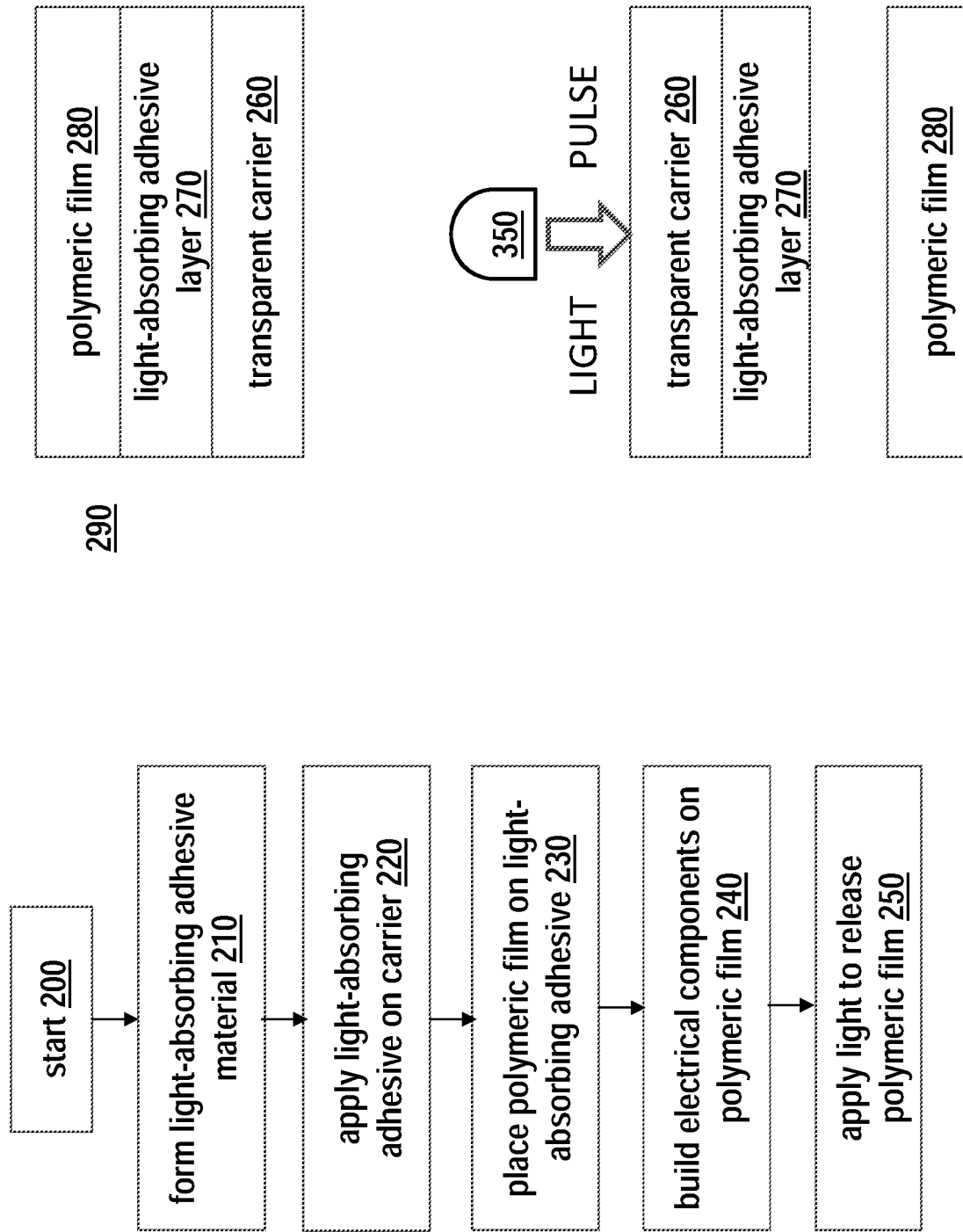
FIG. 2 is a flow diagram of a method for attaching and detaching a polymeric film from a carrier, according to one embodiment.

With reference now to FIG. 2, there is depicted a flow diagram of a method for attaching and detaching a polymeric film from a carrier, according to one embodiment.

Starting at block 200, a broadband light-absorbing adhesive is initially formed by combining an adhesive material combined with a broadband light-absorbing material, as shown in block 210.

The adhesive material may be polar or non-polar. It may be a thermoplastic or thermoset. It may be cured thermally, via ultra-violet light, via chemical reaction, or may be formed via solvent evaporation.

The broadband light-absorbing material is a pigmented material such as carbon black. Alternatively, the light-absorbing material may be a dye or a combination of multiple dyes.

Alternatively, the broadband light-absorbing adhesive can be formed by combining an adhesive material with a broadband light-absorbing material and a gas generating material. The adhesive material and the broadband light-absorbing material are the same as above. The gas generating material is a material that sublimates or boils at a temperature lower than the boiling temperature of the adhesive material. Some gas generating materials can also serve as light-absorbing material. For example, a sublimation dye is both optically absorptive of the beam from a flashlamp and sublimes to generate gas when it is heated to a particular temperature.

The broadband light-absorbing adhesive is then applied as a broadband light-absorbing adhesive layer, such as a broadband light-absorbing adhesive layer 270 in FIG. 2A, on one side of a transparent rigid carrier, such as a transparent carrier 260 in FIG. 2A, as depicted in block 220. Carrier 260 may be made of quartz, glass or any rigid material that transmits light emitted by a flashlamp. An exemplary example includes Corning Eagle XG glass, which is a common type of glass used in the display industry.

Next, a polymeric film 280 is placed on broadband light-absorbing adhesive layer 270, as shown in block 230. Pressure can be applied on polymeric film 280 to adhere polymeric film 280 to broadband light-absorbing adhesive layer 270 and carrier 260. Polymeric film 280 may be heated during the application of pressure onto polymeric film 280 in order to increase the adhesive bond between polymeric film 280 and carrier 260. At this point, a polymeric film stack is formed, such as a polymeric film stack 290 shown in FIG. 2A, which includes transparent carrier 260, broadband light-absorbing adhesive layer 270, and polymeric film 280.

Electronic devices and/or electrical components are then built on one surface of polymeric film 280, as depicted in block 240. Afterwards, polymeric film 280 is detached (debonded) from polymeric film stack 290 by exposing the non-wafer side of transparent carrier 260 to an intense pulse of light from a flashlamp, such as a flashlamp 350 in FIG. 2B, as shown in block 250, in order to heat up broadband light-absorbing adhesive layer 270. As a result, broadband light-absorbing adhesive layer 270 is heated to a point that polymeric film 280 will be released from polymeric film stack 290, as shown in block 250.

Any residual adhesive layer 270 can be rinsed away with a solvent to leave only the polymeric film stack 290 with electronic structures. For example, polyamic acid can be deposited onto the adhesive and thermally cured to create a thin layer of polyimide on top of the adhesive. Electronic materials can then be deposited and cured on the polyimide, and components can be placed and soldered to create the final structure. This technique allows the ability to fabricate electronic components on very thin films of polymer with thicknesses ranging from 3-30 microns.

Figure 3:
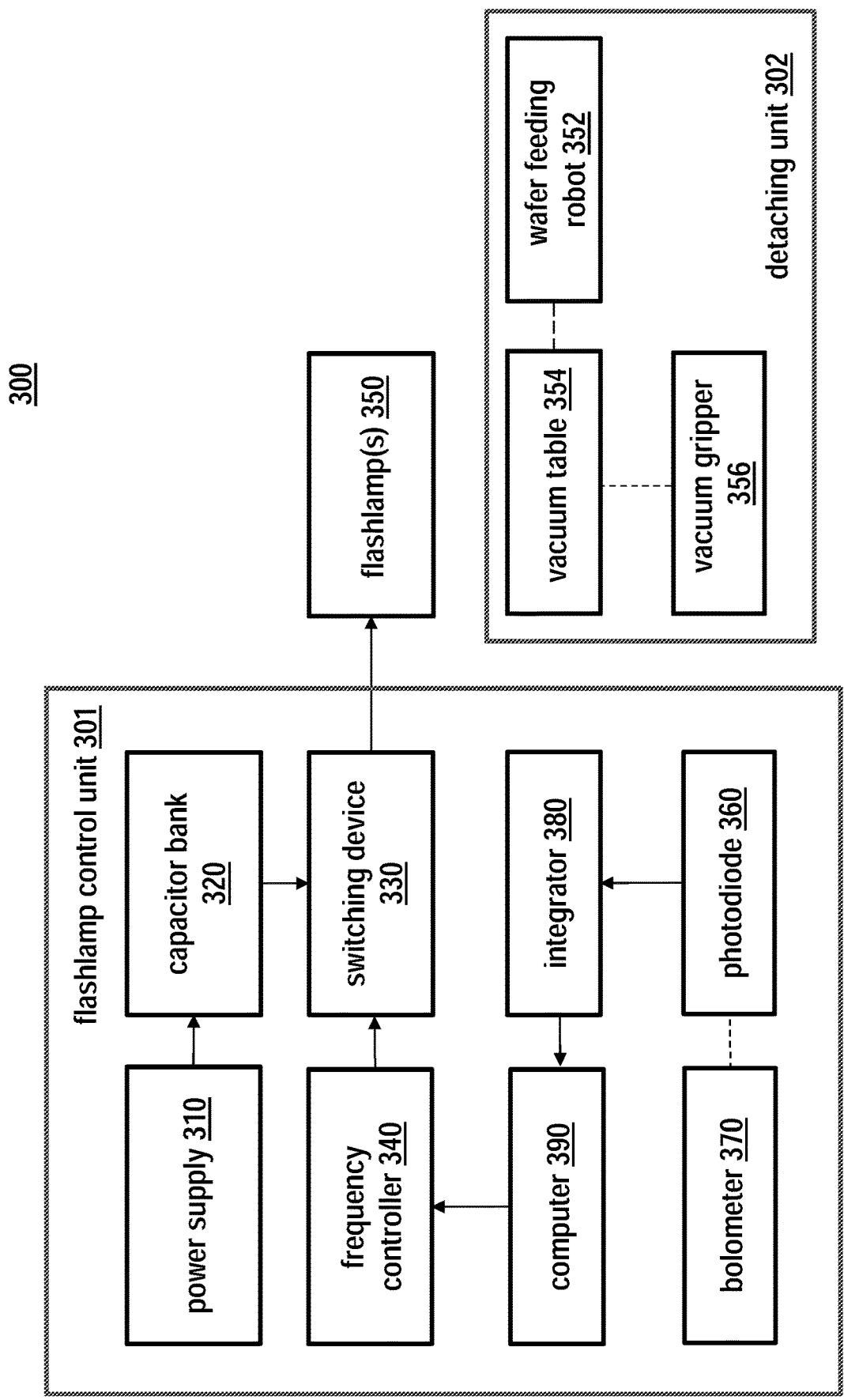
FIG. 3 is a block diagram of an apparatus for attaching and detaching a wafer from a carrier, according to one embodiment.

Referring now to FIG. 3, there is depicted a block diagram of an apparatus for performing detachment of a substrate from a carrier, according to one embodiment. As shown, an apparatus 300 includes a flashlamp control unit 301 and detaching unit 302. Flashlamp control unit 301 includes a capacitor-bank-charging power supply 310, a capacitor bank 320, an insulated gate barrier transistor (IGBT)-based switching device 330, a frequency controller 340, a photodiode 360, a bolometer 370, an integrator 380, and a computer 390. Computer 390 includes a processor and various storage devices that are well-known to those skilled in the art. The capacitors in capacitor bank 320 are, for example, electrolytic capacitors. The capacitors in capacitor bank 320 may also be pulse discharge capacitors. Capacitor bank 320 may alternatively be switched with a silicon-controlled rectifier (SCR) switching device.

Capacitor bank 320 can be charged by capacitor-bank-charging power supply 310. Current from capacitor bank 320 is then discharged into flashlamp 350 via IGBT-based switching device 330 while IGBT-based switching device 330 is being switched on-and-off repeatedly by frequency controller 340 during the discharge. Frequency controller 340 controls the gating of IGBT-based switching device 330 that, in turn, controls the switching frequency of the discharge. The repeated on-and-off switching of IGBT-based switching device 330 is intended to modulate the current flow from capacitor bank 320 to flashlamp(s) 350, which in turn switches flashlamp(s) 350 on and off. In other words, the frequency or pulse length of light pulses emitted by flashlamp(s) 350 is dictated by frequency controller 340.

Photodiode 360 within flashlamp control unit 301 needs to be calibrated before operation. Photodiode 360 can be calibrated by using bolometer 370 that is National Institute of Standards and Technology (NIST) traceable. During calibration, both photodiode 360 and bolometer 370 are exposed to a single light pulse emitted from flashlamp 350. Bolometer 370 measures the radiant exposure or energy per area (in unit $J/cm^2$) of the single light pulse, and photodiode 360 measures the instantaneous power density (in unit $W/cm^2$) of the same light pulse. The instantaneous power density signals from photodiode 360 are then integrated by integrator 380 to yield a radiant exposure value of the same single light pulse, and the radiant exposure measurement from bolometer 370 is divided by this radiant exposure value from integrator 380 to generate a calibration factor as follows:

$$\text{calibration factor} = \frac{\text{radiant exposure measurement}}{\text{radiant exposure value}}$$

After calibration, the photodiode 360/integrator 380 combination can be utilized to provide radiant exposure information of each light pulse emitted from flashlamp 350. Basically, the radiant exposure information of a light pulse emitted from flashlamp 350 can be calculated by multiplying the calibration factor obtained during calibration with the output value of integrator 380 (which is the radiant exposure value of the light pulse emitted from flashlamp 350 formed by integrating the instantaneous power signals of the light pulse emitted from flashlamp 350 measured by photodiode 360).

Detaching unit 302 includes a feeding robot 352, a detaching vacuum table 354, and a vacuum gripper 356.

Prior to detaching, a dicing tape 410 is mechanically clamped to wafer stack 190 via retaining rings 420 to form a bonded wafer assembly, as shown in FIG. 4. Wafer feeding robot 352 conveys the bonded wafer assembly to detaching vacuum table 354. A vacuum is then applied on dicing tape 410 from detaching vacuum table 354. Then, a light pulse from flashlamp 350 is utilized to illuminate the bonded wafer assembly from the transparent side of carrier 160 to detach processed wafer 180 from carrier 160. If the beam area of flashlamp 350 is smaller than the area of wafer 180, then wafer 180 is conveyed relative to flashlamp 350 by detaching vacuum table 354 to expose the remaining portions of wafer 180 with another light pulse. Next, the bonded wafer assembly along with detaching table 354 is conveyed to a separation station.

At the separation station, vacuum gripper 356 separates carrier 160 from the bonded wafer assembly, while wafer 180 mounted on dicing tape 410 is being held down by detaching vacuum table 354. Both carrier 160 and wafer 180 on dicing tape 410 are conveyed to a cleaning station to remove any residual adhesive (i.e., adhesive layer 170 from FIG. 1A). Residual adhesive may be removed with a wet process via solvent or a dry process with plasma.

At this point, wafer 180 is so fragile that the vacuum being applied to wafer 180 should be distributed across wafer 180 so as not to break it during removal. This may be accomplished with multiple suction cups 430 distributed across the surface of wafer 180, as depicted in FIG. 4. Alternatively, the vacuum may be applied by a distributed vacuum, such as a vacuum table with perforated holes. Vacuum table 354 may have a polymer on its surface so that wafer 180 is not damaged during handling.

During the detaching process, apparatus 300 may have 5-lamp drivers per flashlamp using 24 mm diameter and 150 mm long lamps with 150 mm×75 mm exposure area per lamp. The flashlamps may be placed parallel to each other to increase the exposure area in increments of 75 mm. For example two flashlamps provide an exposure area of 150 mm×150 mm, three flashlamps provide an exposure area of 150 mm×225 mm, four flashlamps provide an exposure area of 150 mm×300 mm, etc. The flashlamps are placed in a common optical cavity, and the exposure is uniform to within 3%. Flashlamp drivers contain capacitors and IGBTs. The current from the capacitors is switched by the IGBTs into the flashlamps. Lamp drivers may be placed in parallel with each other to increase the peak current supplied to the flashlamps. A variable of the flashlamp system is the charging voltage of the capacitors, the total capacitance, which is determined by the number of flashlamp drivers, and the length of the pulse of light, which is switched on and off by the IGBTs. All parameters are controlled by a computer. Silicon wafer may be debonded from glass carrier plates at 900-950V at pulse durations of 50-150 microseconds, which corresponds to 1-6 J/cm$^2$ emitted with each pulse. The peak radiant power of flashlamp 350 is greater than 20 KW/cm$^2$, more preferable greater than 30 KW/cm$^2$, and even more preferable greater than 40 KW/cm$^2$.

As has been described, the present invention provides an improved method for detaching a substrate from a carrier. One advantage of this method is that carrier 210 does not need to be sputtered with a light absorbing layer, which makes the supply chain management of the process simplified as well as potentially saving money. Another advantage of this method is that the absorption of the adhesive can be made higher than that of typical sputtered metals. Tungsten, for example, is only about 45% absorptive of the flashlamp emission. This allows for reduced energy in the flashlamp emission required to reach the same temperature in the light absorber. That, in turn, increases the lifetime of a flashlamp. Additionally, this method allows the pulse length of the flashlamp emission to be decreased. This reduces the heat diffusion to a substrate and a carrier during the detaching process, and thus reduces both the thermal shock and total thermal budget to the substrate.

While the invention has been particularly shown and described with reference to a preferred embodiment, it will be understood by those skilled in the art that various changes in form and detail may be made therein without departing from the spirit and scope of the invention.

What is claimed is:

1. A method comprising:
    combining an adhesive material, a sublimation dye and a light-absorbing material to form a broadband light-absorbing adhesive;
    applying a layer of said broadband light-absorbing adhesive on one side of a transparent carrier;
    placing a wafer on said broadband light-absorbing adhesive and said transparent carrier to form a wafer stack;
    processing said wafer; and
    applying a light pulse from a flashlamp to heat up said broadband light-absorbing adhesive layer in order to release said wafer from said wafer stack.

2. The method of claim 1, wherein said light-absorbing material is a dye.

3. The method of claim 1, wherein said light-absorbing material is a pigmented material.

4. The method of claim 3, wherein said pigmented material is carbon black.

5. The method of claim 1, wherein said carrier is made of quartz.

6. The method of claim 1, wherein said carrier is made of glass.

7. The method of claim 1, wherein said sublimation dye gas generating material is a material that sublimates or boils at a temperature lower than the boiling temperature of said adhesive material.

8. The method of claim 1, wherein said broadband light-absorbing adhesive absorbs greater than 80% of said light pulse from said flashlamp.

9. A method comprising:
    combining an adhesive material, a sublimation dye and a light-absorbing material to form a broadband light-absorbing adhesive;
    applying a layer of said broadband light-absorbing adhesive on one side of a transparent carrier;
    placing a polymeric film on said broadband light-absorbing adhesive and said transparent carrier to form a polymeric film stack;
    processing said polymeric film; and
    applying a light pulse from a flashlamp to heat up said broadband light-absorbing adhesive layer in order to release said polymeric film from said polymeric film stack.

10. The method of claim 9, wherein said light-absorbing material is a dye.

11. The method of claim 9, wherein said light-absorbing material is a pigmented material.

12. The method of claim 11, wherein said pigmented material is carbon black.

13. The method of claim 9, wherein said carrier is made of quartz.

14. The method of claim 9, wherein said carrier is made of glass.

15. The method of claim 14, wherein said sublimation dye sublimates or boils at a temperature lower than the boiling temperature of said adhesive material.

16. The method of claim 9, wherein said broadband light-absorbing adhesive absorbs greater than 80% of said light pulse from said flashlamp.

\* \* \* \* \*